(12) United States Patent
Takahashi et al.

(10) Patent No.: US 11,689,173 B2
(45) Date of Patent: Jun. 27, 2023

(54) FILTER MODULE

(71) Applicant: Murata Manufacturing Co., Ltd., Kyoto (JP)

(72) Inventors: Kazuhiro Takahashi, Kyoto (JP); Tetsurou Ashida, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 124 days.

(21) Appl. No.: 16/896,542

(22) Filed: Jun. 9, 2020

(65) Prior Publication Data

US 2020/0389144 A1 Dec. 10, 2020

(30) Foreign Application Priority Data

Jun. 10, 2019 (JP) ................. 2019-107984

(51) Int. Cl.
*H03H 7/01* (2006.01)
*H05K 1/18* (2006.01)

(52) U.S. Cl.
CPC ........... *H03H 7/0115* (2013.01); *H05K 1/181* (2013.01); *H05K 2201/1006* (2013.01)

(58) Field of Classification Search
CPC ......... H03H 2001/0085; H03H 7/0115; H05K 1/181
USPC ........................................................ 333/185
See application file for complete search history.

(56) References Cited

U.S. PATENT DOCUMENTS

| | | | |
|---|---|---|---|
| 9,807,882 B1 | 10/2017 | Berdy et al. | |
| 2005/0116352 A1 | 6/2005 | Warashina et al. | |
| 2009/0108958 A1* | 4/2009 | Hadano ............... | H03H 7/1758 333/175 |
| 2012/0319801 A1 | 12/2012 | Taniguchi | |
| 2015/0137909 A1 | 5/2015 | Okuda et al. | |
| 2016/0079952 A1 | 3/2016 | Kikuchi | |

FOREIGN PATENT DOCUMENTS

| | | |
|---|---|---|
| CN | 109644549 A | 4/2019 |
| KR | 10-2005-0046618 A | 5/2005 |
| KR | 10-2015-0038261 A | 4/2015 |
| WO | 2011/114851 A1 | 9/2011 |
| WO | 2014/192431 A1 | 12/2014 |

\* cited by examiner

*Primary Examiner* — Rakesh B Patel
(74) *Attorney, Agent, or Firm* — Pearne & Gordon LLP (57) ABSTRACT

A filter element is mounted on a module substrate. The filter element includes a ground terminal and a pair of signal terminals. The module substrate includes a ground plane, a ground land, and an inductance adjusting line that connects the ground land to the ground plane. The ground terminal of the filter element is connected to the ground land of the module substrate. The inductance adjusting line includes an in-plane extending portion that extends in an in-plane direction of the module substrate.

14 Claims, 11 Drawing Sheets

FILTER MODULE

This application claims priority from Japanese Patent Application No. 2019-107984 filed on Jun. 10, 2019. The content of this application is incorporated herein by reference in its entirety.

BACKGROUND OF THE DISCLOSURE

1. Field of the Disclosure

The present disclosure relates to a filter module.

2. Description of the Related Art

Hitherto, various radio-frequency (RF) filters have been used in radio equipment, such as cellular phones. An RF filter has a function of passing only signals of a desired frequency band, thereby reducing an influence of signals outside the pass band on an RF circuit, for example, degradation of the signal-to-noise ratio. International Publication No. WO/2011/114851 discloses a multilayer RF filter. The multilayer RF filter has a multilayer structure including a plurality of dielectric layers laminated one on top of another, each of which has a conductor pattern.

The multilayer RF filter disclosed in International Publication No. WO/2011/114851 includes a ground impedance adjusting circuit for reducing the parasitic inductance of a conductor (wiring line) that connects a circuit function section implementing a filter function and a ground electrode. The ground impedance adjusting circuit prevents degradation of attenuation characteristics in an RF band. The ground electrode of the multilayer RF filter and the ground of a module substrate on which the multilayer RF filter is mounted are strongly connected to each other so that an additional parasitic inductance does not occur between the ground electrode and the ground.

BRIEF SUMMARY OF THE DISCLOSURE

In an RF filter, the attenuation characteristics outside the pass band are requested to be finely adjusted in accordance with the frequency environment in actual use, the frequency characteristics of other components, and the like. In the multilayer RF filter disclosed in International Publication No. WO/2011/114851, the attenuation characteristics can be finely adjusted by finely adjusting the shape or size of the conductor pattern of each conductor layer. In other words, the shape or size of the conductor pattern is to be changed according to the attenuation characteristics to be obtained, and thus the cost of development or mass production increases.

An object of the present disclosure is to provide a filter module capable of easily adjusting attenuation characteristics.

According to preferred embodiments of the present disclosure, there is provided a filter module including a module substrate and a filter element mounted on the module substrate. The filter element includes a ground terminal and a pair of signal terminals. The module substrate includes a ground plane, a ground land, and an inductance adjusting line that connects the ground land to the ground plane. The ground terminal of the filter element is connected to the ground land of the module substrate. The inductance adjusting line includes an in-plane extending portion that extends in an in-plane direction of the module substrate.

As a result of adjusting the inductance of the inductance adjusting line, the attenuation characteristics of the filter module can be adjusted without changing the attenuation characteristics of the filter element.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Prior to description of embodiments of the present disclosure, the results of simulations on filter characteristics performed by the inventors of the present application will be described.

Figure 1A:
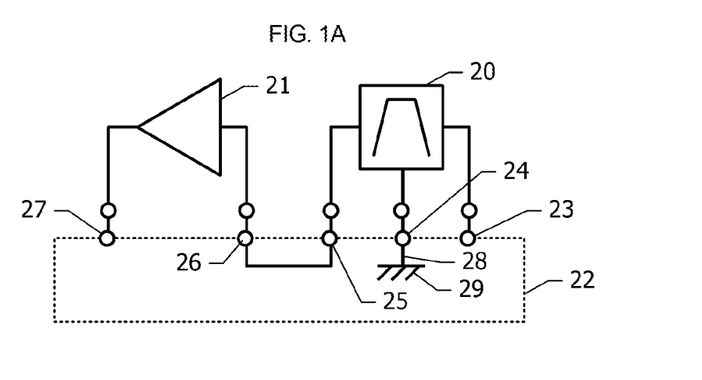
FIG. 1A is a block diagram of a filter module serving as a simulation target.

FIG. 1A is a block diagram of a filter module serving as a simulation target. A filter element 20 and a low-noise amplifier 21 are mounted on a module substrate 22. An input terminal, a ground terminal, and an output terminal of the filter element 20 are connected to a first signal land 23, a ground land 24, and a second signal land 25 of the module substrate 22, respectively. An input terminal and an output terminal of the low-noise amplifier 21 are connected to a third signal land 26 and a fourth signal land 27 of the module substrate 22, respectively. The ground land 24 is connected to a ground plane 29 in the module substrate 22 via a via conductor 28. The second signal land 25 and the third signal land 26 are connected to each other by a transmission line in the module substrate 22. A transmission coefficient S21 from the first signal land 23 to the fourth signal land 27 is calculated by using an electromagnetic field simulator.

Figure 1B:
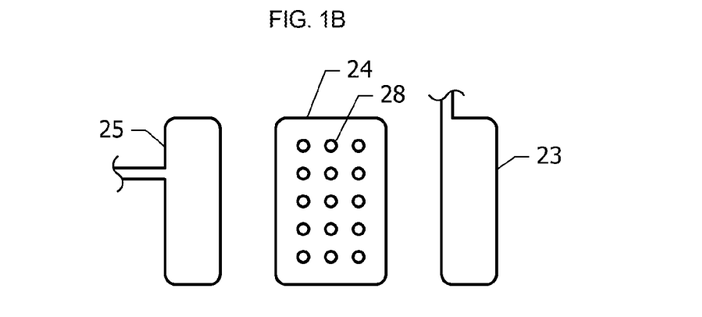
FIG. 1B, FIG. 1C, and FIG. 1D are diagrams each illustrating the disposition in a plan view of a first signal land, a ground land, a second signal land, and a via conductor or via conductors of a sample serving as a simulation target.
Figure 1C:
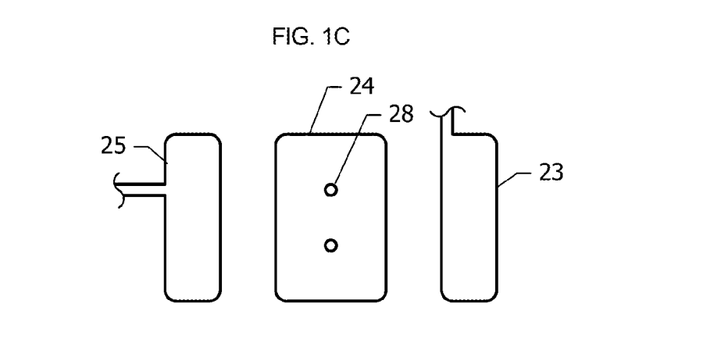
Figure 1D:
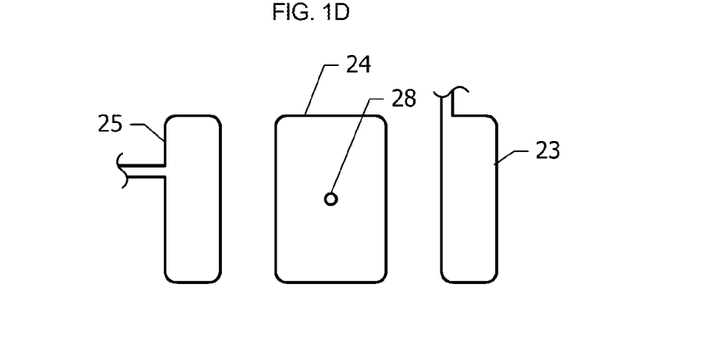

FIG. 1B, FIG. 1C, and FIG. 1D are diagrams each illustrating the disposition in a plan view of the first signal land 23, the ground land 24, the second signal land 25, and the via conductor 28 or via conductors 28 of a sample serving as a simulation target. In each sample, the first signal land 23, the ground land 24, and the second signal land 25 are arranged in a line in this order. In the samples illustrated in FIG. 1B, FIG. 1C, and FIG. 1D, the numbers of via conductors 28 disposed are 15, 2, and 1, respectively.

Figure 2:
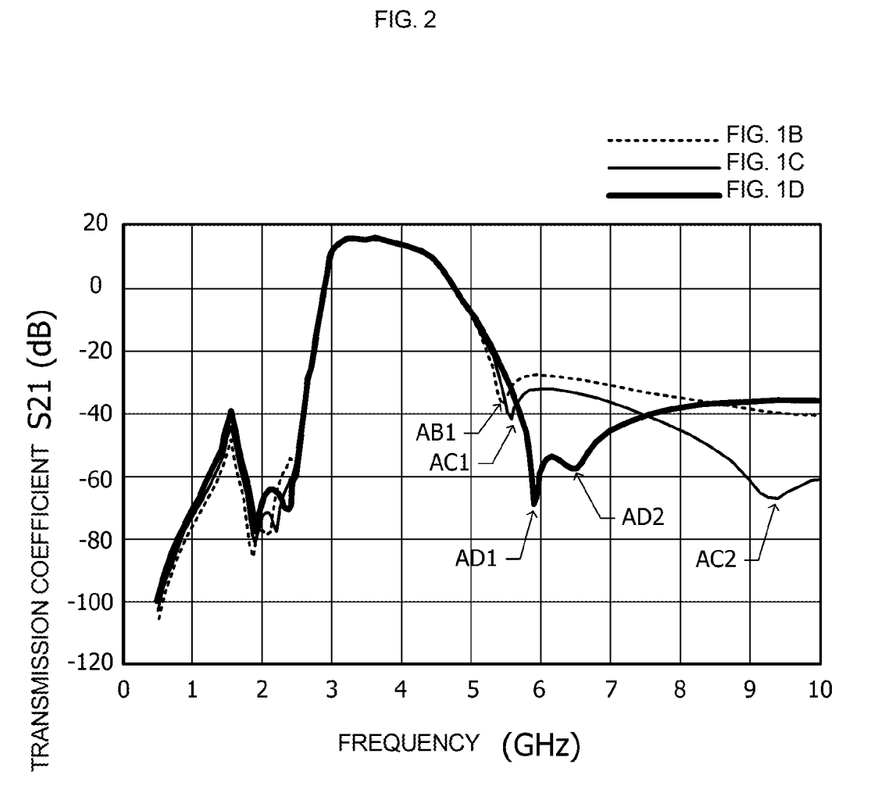
FIG. 2 is a graph illustrating the simulation results of a transmission coefficient.

FIG. 2 is a graph illustrating the simulation results of the transmission coefficient S21. The horizontal axis represents frequency in "GHz", and the vertical axis represents transmission coefficient S21 in "dB". In the graph in FIG. 2, the broken line, the thin solid line, and the bold solid line represent the simulation results of the samples illustrated in FIG. 1B, FIG. 1C, and FIG. 1D, respectively. Each sample has a pass band ranging from about 3.3 GHz to about 4.2 GHz corresponding to Band n77 of the fifth-generation mobile communication system (5G).

In the sample in FIG. 1D, there are two attenuation poles AD1 and AD2 on a higher-frequency side than the pass band. Also, in the sample in FIG. 1C, there are two attenuation poles AC1 and AC2 on a higher-frequency side than the pass band. In the sample in FIG. 1B, there is an attenuation pole AB1 on a higher-frequency side than the pass band. The second attenuation pole of the sample in FIG. 1B is in the region of frequencies of about 10 GHz and higher.

Among the two attenuation poles in each of the samples, the attenuation poles AD1, AC1, and AB1 on the lower-frequency side are located on a higher-frequency side as the number of via conductors 28 decreases. On the other hand, the attenuation poles AD2 and AC2 on the higher-frequency side are located on a lower-frequency side as the number of via conductors 28 decreases.

The number of via conductors 28 has an influence on the parasitic inductance between the ground land 24 (FIG. 1A) and the ground plane 29 (FIG. 1A). The parasitic inductance increases as the number of via conductors 28 decreases. The difference in attenuation characteristics among the samples illustrated in FIG. 2 results from the difference in parasitic inductance. This implies that adjusting of the parasitic inductance between the ground land 24 and the ground plane 29 makes it possible to adjust the attenuation characteristics in a state where the filter element 20 is mounted on the module substrate 22.

First Embodiment

Hereinafter, a filter module according to a first embodiment will be described with reference to FIG. 3 to FIG. 6B.

Figure 3:
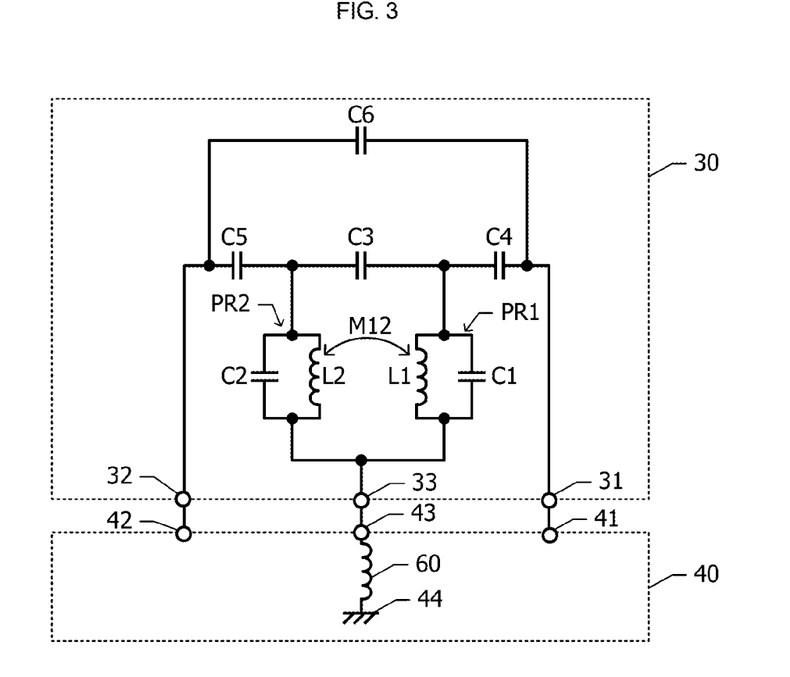
FIG. 3 is an equivalent circuit diagram of a filter element and a module substrate included in a filter module according to a first embodiment.

FIG. 3 is an equivalent circuit diagram of a filter element 30 and a module substrate 40 included in the filter module according to the first embodiment. The filter element 30 includes a first signal terminal 31, a second signal terminal 32, a ground terminal 33, and two parallel resonance circuits PR1 and PR2. The parallel resonance circuit PR1 is constituted by an inductor L1 and a capacitor C1 connected in parallel to each other, and the parallel resonance circuit PR2 is constituted by an inductor L2 and a capacitor C2 connected in parallel to each other.

The first signal terminal 31 and one end of the parallel resonance circuit PR1 are coupled to each other via a capacitor C4, and the other end of the parallel resonance circuit PR1 is connected to the ground terminal 33. The second signal terminal 32 and one end of the parallel resonance circuit PR2 are coupled to each other via a capacitor C5, and the other end of the parallel resonance circuit PR2 is connected to the ground terminal 33. The parallel resonance circuits PR1 and PR2 are coupled to each other via a capacitor C3. Furthermore, the inductors L1 and L2 are coupled to each other by a mutual inductance M12. The first signal terminal 31 and the second signal terminal 32 are coupled to each other via a capacitor C6.

A first signal land 41, a second signal land 42, and a ground land 43 are disposed on a surface of the module substrate 40. The module substrate 40 includes therein a ground plane 44. The ground land 43 and the ground plane 44 are connected to each other via an inductance adjusting line 60.

The first signal terminal 31, the second signal terminal 32, and the ground terminal 33 of the filter element 30 are connected to the first signal land 41, the second signal land 42, and the ground land 43 of the module substrate 40, respectively.

Figure 4:
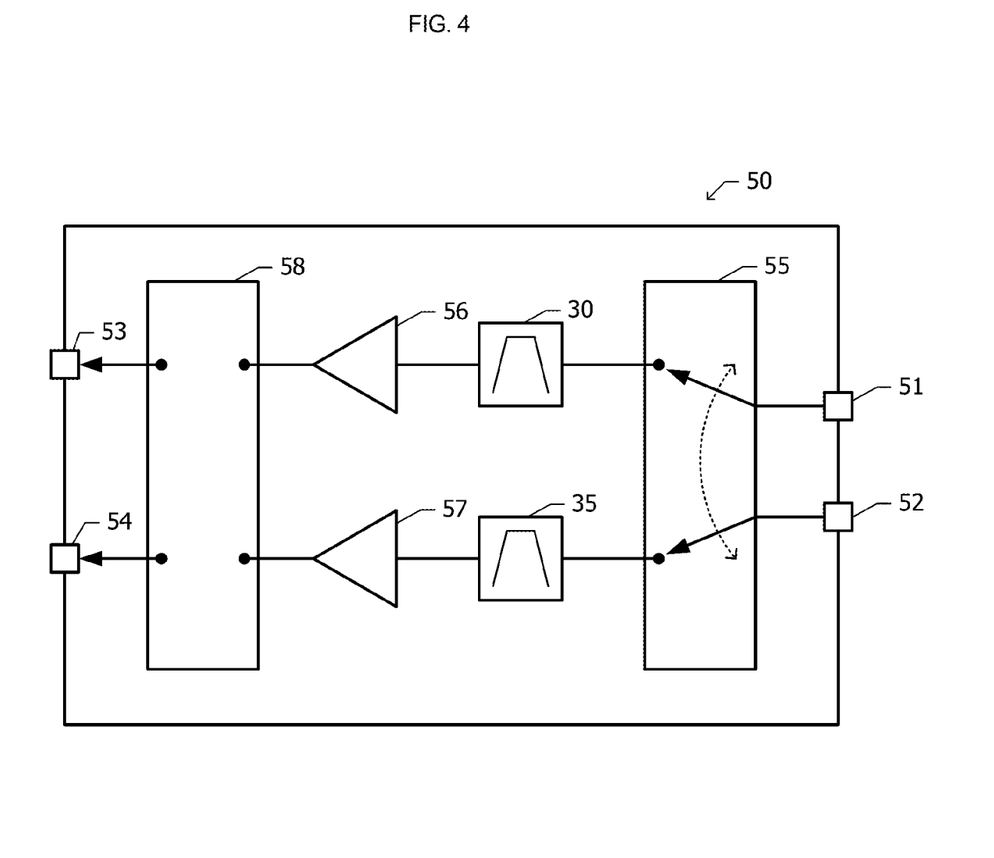
FIG. 4 is a block diagram of the filter module according to the first embodiment.

FIG. 4 is a block diagram of a filter module 50 according to the first embodiment. The filter module 50 according to the first embodiment includes two antenna terminals 51 and 52 and two output terminals 53 and 54. The two antenna terminals 51 and 52 are connected to two filter elements 30 and 35 via a radio-frequency (RF) switch 55. The filter element 30 is a band pass filter that passes signals of the frequency band of Band n77 of 5G, and the filter element 35 is a band pass filter that passes signals of the frequency band of Band n79 of 5G.

The signals passed through the filter elements 30 and 35 are inputted to low-noise amplifiers 56 and 57, respectively. The signals amplified by the low-noise amplifiers 56 and 57 are outputted to the outside from the output terminals 53 and 54, respectively, via an RF switch 58.

Figure 5A:
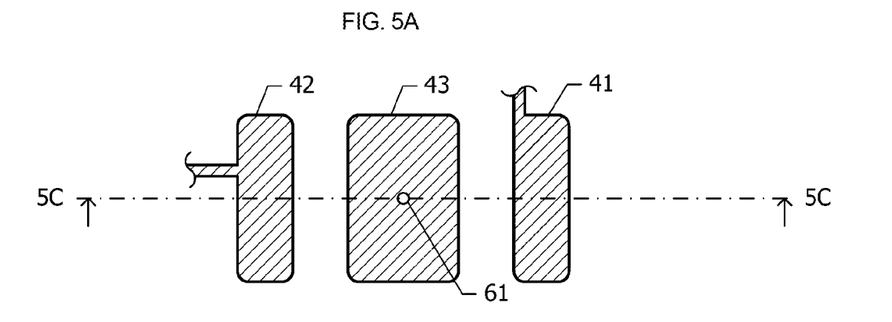
FIG. 5A is a plan view of a surface conductor layer in which a first signal land, a second signal land, and a ground land are disposed, of the module substrate.
Figure 5B:
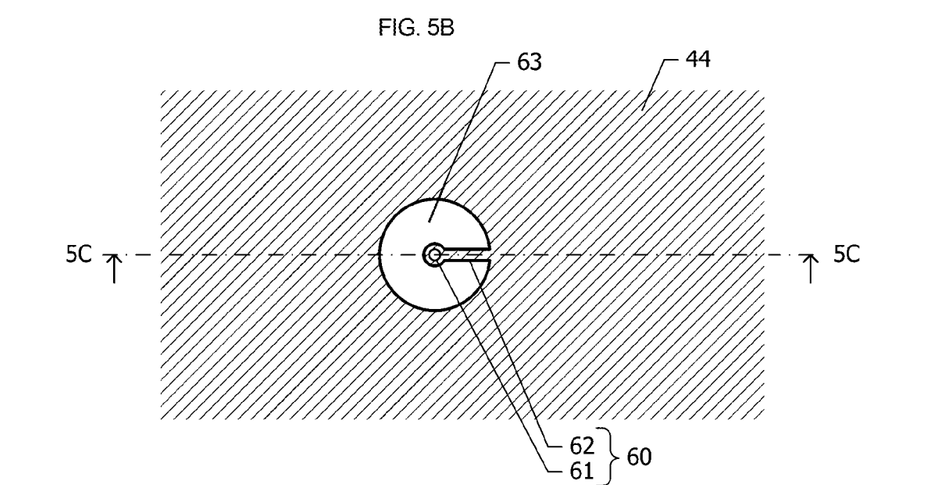
FIG. 5B is a plan view of a conductor layer in which a ground plane is disposed, of the module substrate.
Figure 5C:
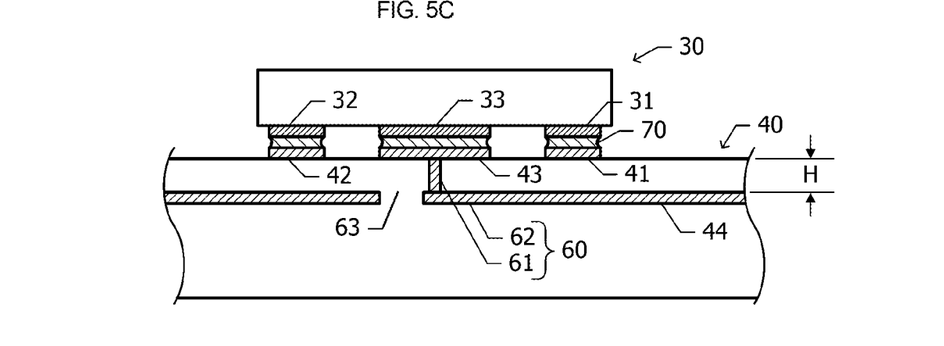
FIG. 5C is a cross-sectional view taken along a chain line 5C-5C in each of FIG. 5A and FIG. 5B.

FIG. 5A is a plan view of a surface conductor layer in which the first signal land 41, the second signal land 42, and the ground land 43 are disposed, of the module substrate 40 (FIG. 3). FIG. 5B is a plan view of a conductor layer in which the ground plane 44 is disposed, of the module substrate 40 (FIG. 3). In FIG. 5A and FIG. 5B, conductor portions are hatched. FIG. 5C is a cross-sectional view taken along a chain line 5C-5C in each of FIG. 5A and FIG. 5B.

In a plan view, the ground land 43 is disposed between the first signal land 41 and the second signal land 42. The first signal terminal 31, the second signal terminal 32, and the ground terminal 33 of the filter element 30 are connected to the first signal land 41, the second signal land 42, and the ground land 43 of the module substrate 40, respectively, via solder 70.

The ground plane 44 is disposed at a position different from the ground land 43 in the thickness direction of the module substrate 40. For example, the ground land 43 is disposed on a surface of a dielectric portion constituting the module substrate 40, whereas the ground plane 44 is disposed inside the dielectric portion. The ground plane 44 is sufficiently larger than the ground land 43 and functions as ground of an RF circuit formed of the filter elements 30 and 35, the low-noise amplifiers 56 and 57 (FIG. 4), and so forth. The ground plane 44 is disposed over almost the entire area of the module substrate 40 in a plan view. The ground plane 44 has a substantially circular opening 63. The opening 63 partially overlaps the ground land 43 in a plan view.

The inductance adjusting line 60 connects the ground land 43 and the ground plane 44. The inductance adjusting line 60 includes one in-plane extending portion 62 that extends in an in-plane direction from the edge of the opening 63 toward the inside of the opening 63, and one via conductor 61 that connects the in-plane extending portion 62 and the ground land 43.

Next, advantageous effects of the first embodiment will be described.

In the first embodiment, the in-plane extending portion 62 that extends in the in-plane direction is connected in series to the via conductor 61 that extends in the thickness direction of the module substrate 40, thereby constituting the inductance adjusting line 60. Thus, the inductance of the inductance adjusting line 60 can be increased compared to a case where the inductance adjusting line 60 is constituted only by the via conductor 61.

To increase the inductance of the via conductor 61, a length H of the via conductor 61 may be increased by increasing the thickness of the dielectric layer disposed between the ground land 43 and the ground plane 44. However, the thickness of the dielectric layer has an influence on the characteristic impedance or the like of a transmission line, and thus the degree of freedom in adjusting the thickness of the dielectric layer is low. Furthermore, an increase in the thickness of the dielectric layer causes an increase in the thickness of the module substrate 40, and thus the filter module is restricted in the height direction. In contrast to this, the degree of freedom in adjusting the length of the in-plane extending portion 62 is higher than the degree of freedom in adjusting the length of the via conductor 61. Thus, advantageous effects can be obtained that the degree of freedom in adjusting the inductance by the inductance adjusting line 60 is high compared to a case where the ground land 43 and the ground plane 44 are connected to each other only by the via conductor 61.

Figure 6A:
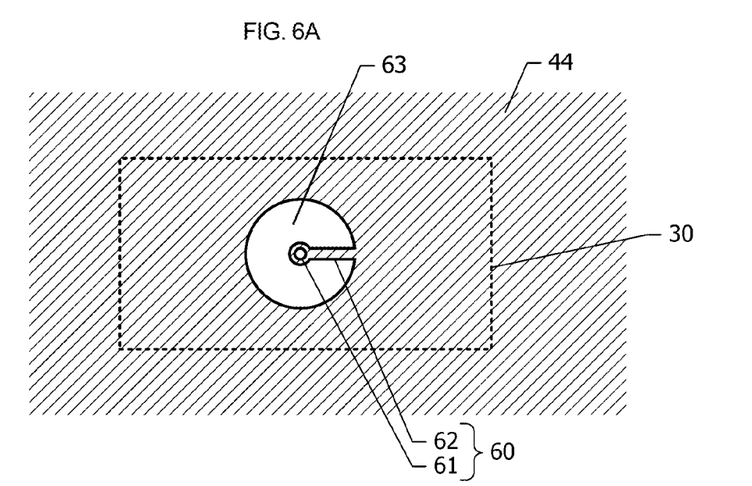
FIG. 6A and FIG. 6B are diagrams each illustrating the relationship in size among the filter element, an in-plane extending portion, an opening, and so forth.
Figure 6B:
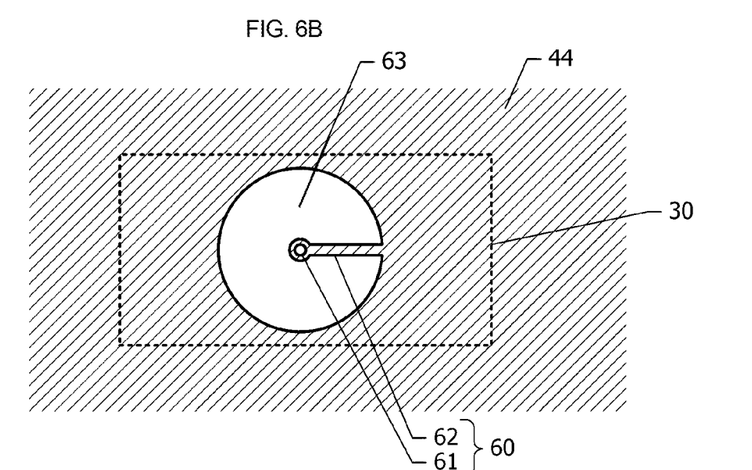
Figure 6C:
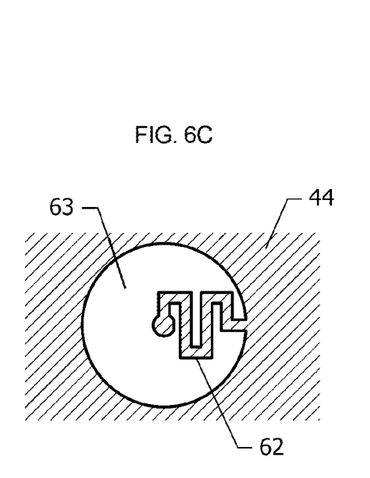
FIG. 6C and FIG. 6D are diagrams each illustrating another example configuration of the in-plane extending portion.
Figure 6D:
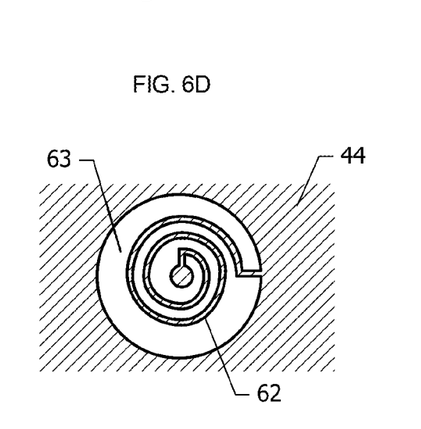

FIG. 6A and FIG. 6B are diagrams each illustrating the relationship in size among the filter element 30, the in-plane extending portion 62, the opening 63, and so forth. The in-plane extending portion 62 is longer in the example illustrated in FIG. 6B than in the example illustrated in FIG. 6A. Thus, the inductance of the inductance adjusting line 60 is different between the example illustrated in FIG. 6A and the example illustrated in FIG. 6B. In this way, changing of the pattern of the ground plane 44 makes it possible to change the inductance of the inductance adjusting line 60. Changing of the pattern of the ground plane 44 disposed in the module substrate 40 makes it possible to form various filter modules having different attenuation characteristics without changing the filter element 30. Instead of or in addition to increasing the size of the opening 63, the in-plane extending portion 62 may be substantially meander-shaped as illustrated in FIG. 6C or substantially spiral-shaped as illustrated in FIG. 6D so as to elongate the in-plane extending portion 62.

Second Embodiment

Hereinafter, a filter module according to a second embodiment will be described with reference to FIG. 7A to FIG. 8B. The description of the same components as those of the filter module 50 according to the first embodiment will be omitted.

Figure 7A:
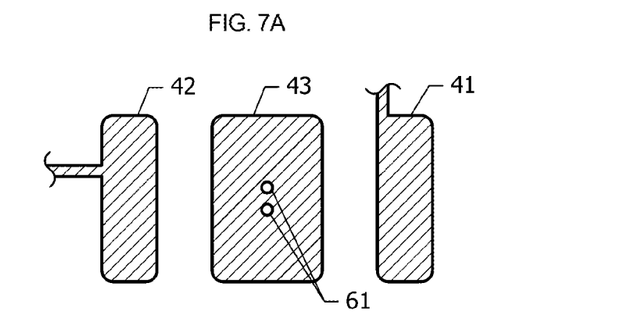
FIG. 7A is a plan view of a surface conductor layer in which a first signal land, a second signal land, and a ground land are disposed, of a module substrate of a filter module according to a second embodiment.
Figure 7B:
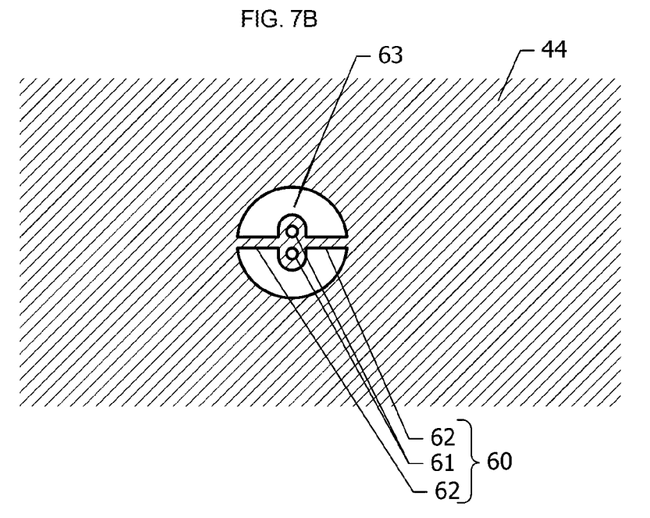
FIG. 7B is a plan view of a conductor layer in which a ground plane is disposed, of the module substrate.

FIG. 7A is a plan view of a surface conductor layer in which the first signal land 41, the second signal land 42, and the ground land 43 are disposed, of the module substrate 40 (FIG. 3) of the filter module according to the second embodiment. FIG. 7B is a plan view of a conductor layer in which the ground plane 44 is disposed, of the module substrate 40 (FIG. 3). In the first embodiment, the inductance adjusting line 60 includes one via conductor 61, and the in-plane extending portion 62 is connected to the ground plane 44 at one portion of the edge of the opening 63. In contrast to this, in the second embodiment, the inductance adjusting line 60 includes two via conductors 61, and the in-plane extending portions 62 is connected to the ground plane 44 at two portions of the edge of the opening 63. The in-plane extending portion 62 has two sections that extend from two different portions of the edge of the opening 63 toward the inside of the opening 63 and communicate with each other in the inside of the opening 63.

Next, advantageous effects of the second embodiment will be described with reference to FIG. 8A and FIG. 8B. The length H of the via conductor 61 (FIG. 5C) depends on the thickness of the dielectric layer. It is difficult to eliminate variations in thickness among individual dielectric layers, and thus variations in length occur among individual via conductors 61. In the second embodiment, the inductance adjusting line 60 includes the two via conductors 61 connected in parallel to each other, which makes it possible to reduce an influence of variations in length among via conductors 61 on the inductance of the inductance adjusting line 60. A simulation is performed to evaluate an influence of variations in length among via conductors 61 on the transmission coefficient S21 in a case where the number of via conductors 61 is one and in a case where the number of via conductors 61 is two.

Figure 8A:
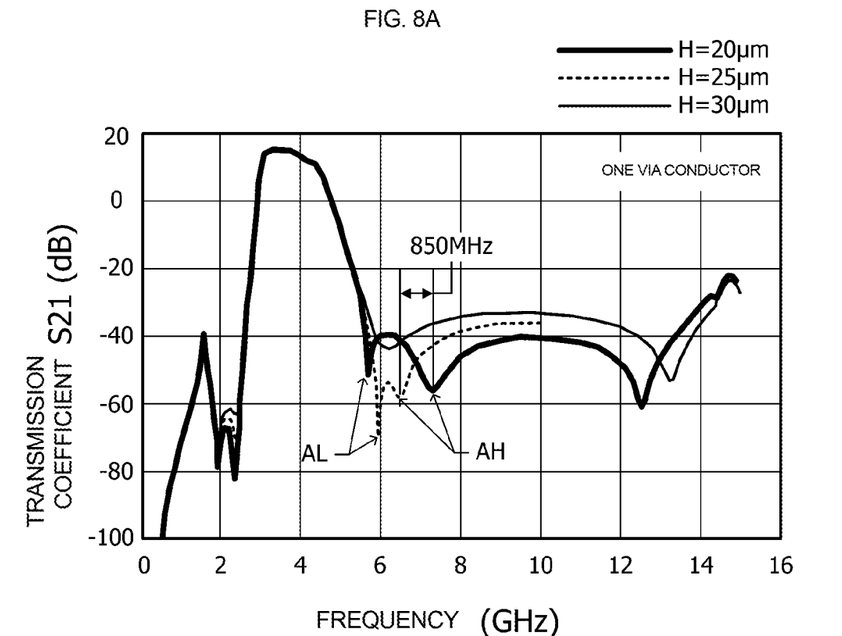
FIG. 8A and FIG. 8B are graphs illustrating simulation results of a transmission coefficient from an input port of a filter element to an output port of a low-noise amplifier in a case where the number of via conductors is one and in a case where the number of via conductors is two, respectively.
Figure 8B:
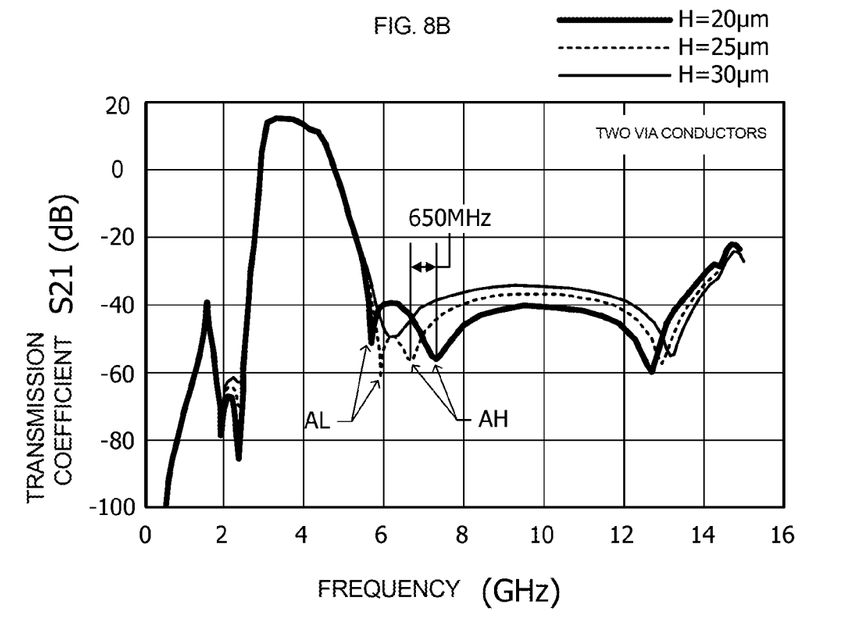

FIG. 8A and FIG. 8B are graphs illustrating simulation results of the transmission coefficient S21 from the input port of the filter element 30 (FIG. 4) to the output port of the low-noise amplifier 56 (FIG. 4) in a case where the number of via conductors 61 is one and in a case where the number of via conductors 61 is two, respectively. The horizontal axis represents frequency in "GHz", and the vertical axis represents transmission coefficient S21 in "dB". In the graphs illustrated in FIG. 8A and FIG. 8B, the bold solid line, the broken line, and the thin solid line represent the transmission coefficients S21 when the length H of the via conductor 61 is 20 µm, 25 µm, and 30 µm, respectively.

In both FIG. 8A and FIG. 8B, a band pass filter for Band n77 of 5G is used. When the length H of the via conductor 61 is 25 µm, there are two attenuation poles AL and AH near a range from about 6 GHz to about 7 GHz higher than the pass band both in FIG. 8A and FIG. 8B. When the length H of the via conductor 61 is decreased to 20 µm, the attenuation pole AH on the higher-frequency side shifts to a higher-frequency side, whereas the attenuation pole AL on the lower-frequency side shifts to a lower-frequency side. The amount of shift of the attenuation pole AL on the lower-frequency side is substantially equal in FIG. 8A and FIG. 8B, but the amount of shift of the attenuation pole AH on the higher-frequency side is about 850 MHz in FIG. 8A and is about 650 MHz in FIG. 8B. In this way, an increase in the number of via conductors 61 causes a decrease in the amount of shift of the attenuation pole AH when the length H of the via conductors 61 varies.

When the length H of the via conductor 61 is increased from 25 μm to 30 μm, the two attenuation poles AL and AH are combined into one attenuation pole both in FIG. 8A and FIG. 8B, and the transmission coefficient S21 increases at the vicinity of 6 GHz. The amount of increase in the transmission coefficient S21 at the vicinity of 6 GHz is smaller in FIG. 8B than in FIG. 8A. In this way, an increase in the number of via conductors 61 causes a decrease in the amount of fluctuation of the transmission coefficient S21 when the length H of the via conductors 61 varies.

From the simulation results illustrated in FIG. 8A and FIG. 8B, it has been confirmed that it is possible to reduce an influence of variations in the length H among via conductors 61 on the transmission coefficient S21 of the filter module.

Hereinafter, a modification example of the second embodiment will be described with reference to FIG. 9.

Figure 9:
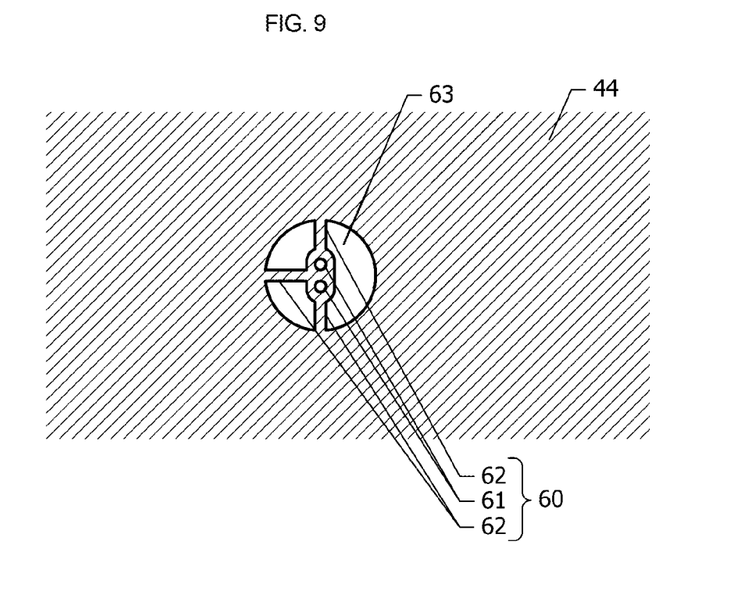
FIG. 9 is a plan view of a conductor layer in which a ground plane is disposed, of a filter module according to a modification example of the second embodiment.

FIG. 9 is a plan view of a conductor layer in which the ground plane 44 is disposed, of a filter module according to the modification example of the second embodiment. In the second embodiment (FIG. 7B), the in-plane extending portion 62 of the inductance adjusting line 60 is connected to the ground plane 44 at two portions of the edge of the opening 63. In the modification example illustrated in FIG. 9, the in-plane extending portion 62 is connected to the ground plane 44 at three portions of the edge of the opening 63. In this way, the in-plane extending portion 62 may be connected to the ground plane 44 at three portions, or four or more portions.

In the second embodiment (FIG. 7A and FIG. 7B) and the modification example thereof (FIG. 9), two via conductors 61 are disposed. Alternatively, three or more via conductors 61 may be disposed. In addition, the opening 63 is substantially circular. Alternatively, the opening 63 may have another shape, for example, the opening 63 may be substantially racetrack-shaped, substantially oval-shaped, or the like.

Third Embodiment

Hereinafter, a filter module according to a third embodiment will be described with reference to FIG. 10. The description of the same components as those of the filter module 50 according to the first embodiment will be omitted.

Figure 10:
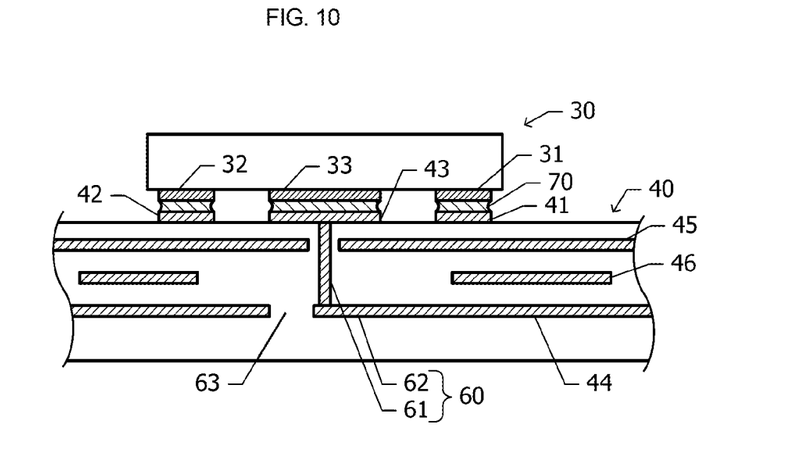
FIG. 10 is a cross-sectional view of a filter module according to a third embodiment.

FIG. 10 is a cross-sectional view of the filter module according to the third embodiment. In the first embodiment (FIG. 5C), the inductance adjusting line 60 is connected to the ground plane 44 disposed in the conductor layer that is the first layer viewed in the thickness direction from the mount surface provided with the filter element 30. In contrast to this, in the third embodiment, the inductance adjusting line 60 is connected to the ground plane 44 disposed in the conductor layer that is the third layer. For example, a ground plane 45 is disposed in the conductor layer serving as the first layer, and a transmission line 46 is disposed in the conductor layer serving as the second layer. The via conductor 61 extends from the ground land 43 through an opening provided in the ground plane 45 in the first layer to reach the ground plane 44 in the third layer.

Next, advantageous effects of the third embodiment will be described. In the third embodiment, the via conductor 61 is longer than in the first embodiment. As a result, the inductance of the inductance adjusting line 60 is larger. The structure according to the third embodiment is effective at increasing the inductance of the inductance adjusting line 60.

Fourth Embodiment

Hereinafter, a filter module according to a fourth embodiment will be described with reference to FIG. 11A. The description of the same components as those of the filter module 50 according to the first embodiment will be omitted.

Figure 11A:
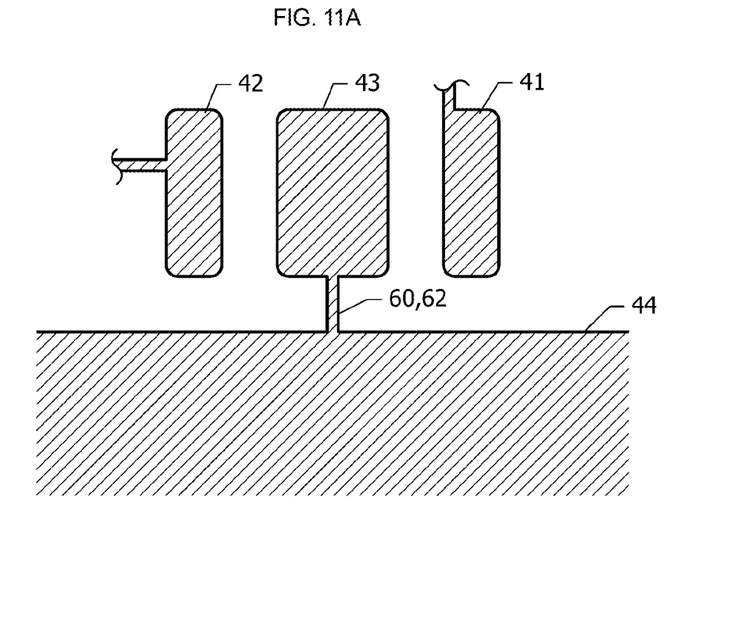
FIG. 11A is a plan view of a surface conductor layer formed on a module substrate of a filter module according to a fourth embodiment.

FIG. 11A is a plan view of a surface conductor layer formed on the module substrate 40 (FIG. 3) of the filter module according to the fourth embodiment. In the first embodiment, the ground plane 44 (FIG. 5C) connected to the inductance adjusting line 60 is disposed in the conductor layer serving as the first layer. In the fourth embodiment, the inductance adjusting line 60 is connected to the ground plane 44 disposed in the surface conductor layer. Thus, the inductance adjusting line 60 does not include a via conductor for connecting different conductor layers, but includes only the in-plane extending portion 62 disposed in the surface conductor layer. A via conductor for connecting to the ground plane 44 is not connected to the ground land 43.

Next, advantageous effects of the fourth embodiment will be described.

The structure according to the fourth embodiment can be adopted in a case where the ground plane 44 is disposed in the surface conductor layer of the module substrate 40. Also, in the fourth embodiment, the inductance of the inductance adjusting line 60 can be adjusted by adjusting the length of the in-plane extending portion 62.

Hereinafter, a modification example of the fourth embodiment will be described with reference to FIG. 11B.

Figure 11B:
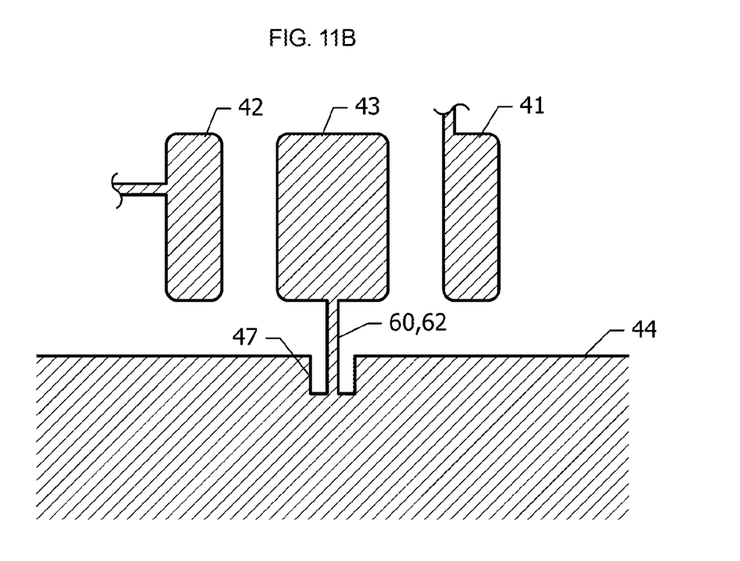
FIG. 11B is a plan view of a surface conductor layer formed on a module substrate of a filter module according to a modification example of the fourth embodiment.

FIG. 11B is a plan view of a surface conductor layer formed on the module substrate 40 (FIG. 3) of a filter module according to the modification example of the fourth embodiment. In this modification example, the ground plane 44 formed in the surface conductor layer has a notch portion 47 extending from the edge toward the inside. The inductance adjusting line 60 is connected to the edge of the deepest portion of the notch portion 47.

In the modification example illustrated in FIG. 11B, the length of the inductance adjusting line 60 can be adjusted by adjusting the depth of the notch portion 47 without depending on the distance between the ground land 43 and the ground plane 44. To increase the inductance value of the inductance adjusting line 60, the inductance adjusting line 60 may be substantially meander-shaped or substantially spiral-shaped.

Fifth Embodiment

Hereinafter, a filter module according to a fifth embodiment will be described with reference to FIG. 12. The description of the same components as those of the filter module 50 according to the first embodiment will be omitted.

Figure 12:
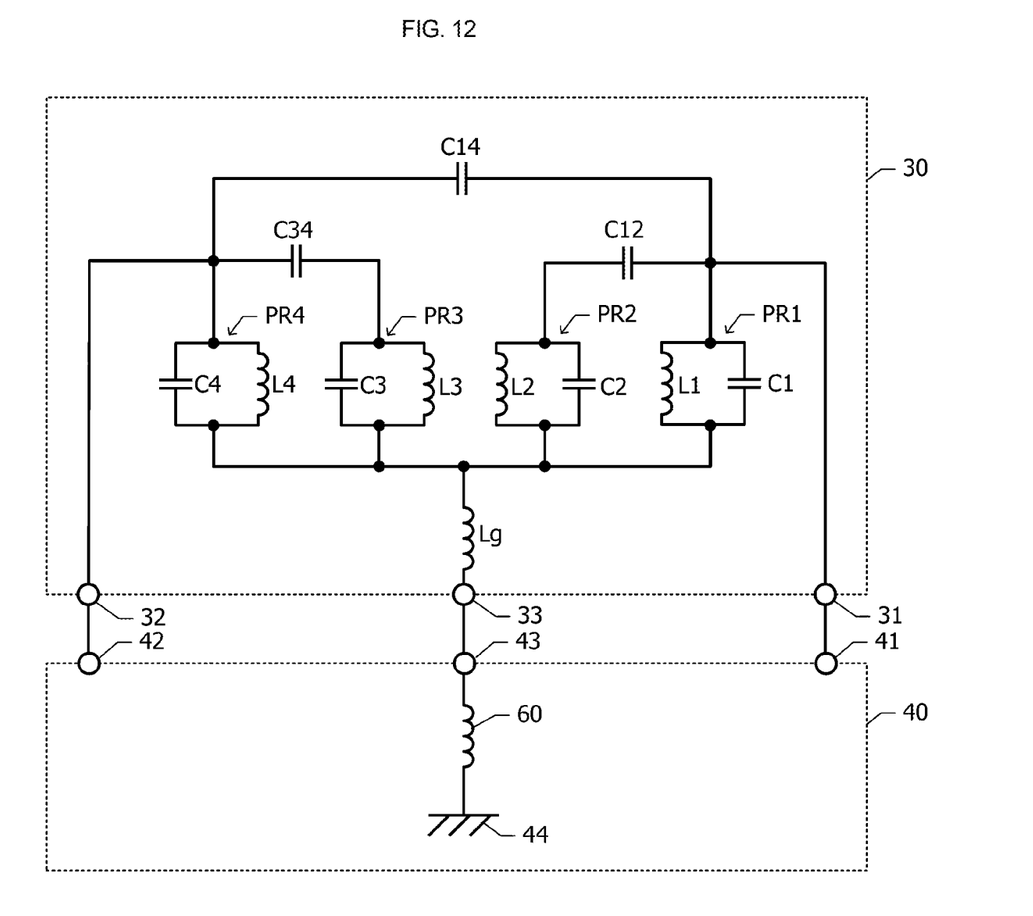
FIG. 12 is an equivalent circuit diagram of a filter module according to a fifth embodiment.

FIG. 12 is an equivalent circuit diagram of the filter module according to the fifth embodiment. The configuration of the module substrate 40 is identical to the configuration of the module substrate 40 according to the first embodiment. The filter element 30 includes four parallel resonance circuits PR1, PR2, PR3, and PR4 in the first to four stages. The parallel resonance circuit PR1 in the first stage includes an inductor L1 and a capacitor C1 connected in parallel to each other. The parallel resonance circuit PR2 in the second stage includes an inductor L2 and a capacitor C2 connected in parallel to each other. The parallel resonance circuit PR3 in the third stage includes an inductor L3 and a capacitor C3 connected in parallel to each other. The parallel resonance circuit PR4 in the fourth stage includes an inductor L4 and a capacitor C4 connected in parallel to each other. The filter element 30 is, for example, a band pass filter for Band n77 of 5G.

One terminals (hereinafter referred to as ground-side terminals) of the four parallel resonance circuits PR1, PR2, PR3, and PR4 are connected to the ground terminal 33 via a common inductor Lg. The terminals on the opposite side of the ground-side terminals of the parallel resonance circuits PR1, PR2, PR3, and PR4 are referred to as signal-side terminals.

The signal-side terminal of the parallel resonance circuit PR1 in the first stage is connected to the first signal terminal 31. A capacitor C12 is connected between the signal-side terminal of the parallel resonance circuit PR1 in the first stage and the signal-side terminal of the parallel resonance circuit PR2 in the second stage. The signal-side terminal of the parallel resonance circuit PR4 in the fourth stage is connected to the second signal terminal 32. A capacitor C34 is connected between the signal-side terminal of the parallel resonance circuit PR3 in the third stage and the signal-side terminal of the parallel resonance circuit PR4 in the fourth stage. A capacitor C14 is connected between the first signal terminal 31 and the second signal terminal 32. The inductors L1, L2, L3, and L4 of the four parallel resonance circuits PR1, PR2, PR3, and PR4 are inductively coupled to each other. The inductance adjusting line 60 of the module substrate 40 is inserted in series to the inductor Lg.

Next, advantageous effects of the fifth embodiment will be described.

In the fifth embodiment, the inductance inserted between the ground plane 44 of the module substrate 40 and the ground-side terminals of the parallel resonance circuits PR1, PR2, PR3, and PR4 can be adjusted by adjusting the inductance of the inductance adjusting line 60 of the module substrate 40. As a result, as in the first embodiment, the attenuation characteristics of the transmission coefficient S21 from the first signal terminal 31 to the second signal terminal 32 can be adjusted without changing the design of the filter element 30.

Hereinafter, a modification example of the fifth embodiment will be described.

As the filter element 30 mounted on the module substrate 40, a filter element including a filter circuit other than the filter circuit according to the first embodiment illustrated in FIG. 3 or the filter circuit according to the fifth embodiment illustrated in FIG. 12 may be used. Also, in this case, the attenuation characteristics of the filter element 30 can be adjusted by adjusting the inductance of the inductance adjusting line 60 of the module substrate 40.

While preferred embodiments of the disclosure have been described above, it is to be understood that the disclosure is not limited to the embodiments and that variations, modifications, improvements, combinations, replacements, and the like will be apparent to those skilled in the art without departing from the scope and spirit of the disclosure. Similar functions and effects of similar configurations of a plurality of embodiments are not described in each embodiment. The scope of the disclosure, therefore, is to be determined solely by the following claims.

What is claimed is:

1. A filter module comprising:
a module substrate; and
a filter element mounted on the module substrate, wherein
the filter element includes a ground terminal and a pair of signal terminals,
the module substrate includes a ground plane, a ground land, and an inductance adjusting line connecting the ground land to the ground plane,
the ground terminal of the filter element is connected to the ground land of the module substrate, and
the inductance adjusting line includes an in-plane extending portion extending in an in-plane direction of the module substrate, the inductance adjusting line and the ground plane are connected together and disposed in a same layer.

2. The filter module according to claim 1, wherein the in-plane extending portion is substantially meander-shaped or substantially spiral-shaped in a plan view.

3. The filter module according to claim 1, further comprising a low-noise amplifier mounted on the module substrate, wherein the filter element is connected to the low-noise amplifier.

4. The filter module according to claim 3, further comprising a switch circuit mounted on the module substrate, wherein the filter element is connected to the switch circuit.

5. The filter module according to claim 1, further comprising a switch circuit mounted on the module substrate, wherein the filter element is connected to the switch circuit.

6. A filter module comprising:
a module substrate; and
a filter element mounted on the module substrate, wherein
the filter element includes a ground terminal and a pair of signal terminals,
the module substrate includes a ground plane, a ground land, and an inductance adjusting line connecting the ground land to the ground plane,
the ground terminal of the filter element is connected to the ground land of the module substrate, and
the inductance adjusting line includes an in-plane extending portion extending in an in-plane direction of the module substrate, wherein
the ground land and the ground plane are disposed at different positions in a thickness direction of the module substrate, the ground plane having an opening,
the opening is disposed at a position at least partially overlapping the ground land in a plan view.

7. The filter module according to claim 6, wherein the inductance adjusting line further includes a plurality of via conductors.

8. The filter module according to claim 7, wherein the in-plane extending portion extends from a plurality of different portions of an edge of the opening toward an inside of the opening.

9. The filter module according to claim 7, wherein the in-plane extending portion is substantially meander-shaped or substantially spiral-shaped in a plan view.

10. The filter module according to claim 6, wherein the in-plane extending portion extends from a plurality of different portions of an edge of the opening toward an inside of the opening.

11. The filter module according to claim 10, wherein the in-plane extending portion is substantially meander-shaped or substantially spiral-shaped in a plan view.

12. The filter module according to claim 6, wherein the in-plane extending portion is substantially meander-shaped or substantially spiral-shaped in a plan view.

13. A filter module comprising:
a module substrate; and
a filter element mounted on the module substrate, wherein the filter element includes a ground terminal and a pair of signal terminals,
the module substrate includes a ground plane, a ground land, and an inductance adjusting line connecting the ground land to the ground plane,
the ground terminal of the filter element is connected to the ground land of the module substrate, and
the inductance adjusting line includes an in-plane extending portion extending in an in-plane direction of the module substrate,
wherein the ground land and the ground plane are disposed in an identical conductor layer, and the inductance adjusting line connects, in the identical conductor layer, the ground land and the ground plane.

14. The filter module according to claim 13, wherein the in-plane extending portion is substantially meander-shaped or substantially spiral-shaped in a plan view.

\* \* \* \* \*